(12) United States Patent
Snyder

(10) Patent No.: US 9,845,524 B2
(45) Date of Patent: Dec. 19, 2017

(54) FIXTURE FOR APPLICATION OF COATINGS AND METHOD OF USING SAME

(71) Applicant: UNITED TECHNOLOGIES CORPORATION, Farmington, CT (US)

(72) Inventor: Brooks E. Snyder, Glastonbury, CT (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 387 days.

(21) Appl. No.: 14/587,841

(22) Filed: Dec. 31, 2014

(65) Prior Publication Data

US 2015/0322563 A1 Nov. 12, 2015

Related U.S. Application Data

(60) Provisional application No. 61/930,321, filed on Jan. 22, 2014.

(51) Int. Cl.
| | |
|---|---|
| *C23C 4/01* | (2016.01) |
| *F01D 5/28* | (2006.01) |
| *C23C 14/22* | (2006.01) |
| *F01D 9/04* | (2006.01) |
| *C23C 14/04* | (2006.01) |
| *C23C 4/134* | (2016.01) |

(52) U.S. Cl.
CPC ............... *C23C 4/01* (2016.01); *C23C 4/134* (2016.01); *C23C 14/042* (2013.01); *C23C 14/22* (2013.01); *F01D 5/288* (2013.01); *F01D 9/04* (2013.01); *Y02T 50/672* (2013.01)

(58) Field of Classification Search
CPC .. C23C 4/01; C23C 4/042; C23C 4/06; C23C 4/134; F01D 5/288
USPC ............................. 427/282, 421.1; 118/504
See application file for complete search history.

(56) References Cited

U.S. PATENT DOCUMENTS

| | | | | |
|---|---|---|---|---|
| 4,530,861 A | * | 7/1985 | Sippel .................. | B05B 15/045 118/503 |
| 5,565,035 A | * | 10/1996 | Sylvestro ................. | C23C 4/01 118/301 |
| 6,485,655 B1 | * | 11/2002 | Das .......................... | B08B 7/00 156/345.19 |
| 8,578,745 B2 | * | 11/2013 | Berndt ..................... | B24C 1/04 29/90.7 |
| 2009/0274562 A1 | * | 11/2009 | Minor ..................... | F01D 5/288 416/241 R |
| 2011/0047777 A1 | * | 3/2011 | Soucy ..................... | B24B 31/00 29/525.01 |
| 2011/0116912 A1 | * | 5/2011 | McCall ................. | C23C 14/042 415/177 |

(Continued)

FOREIGN PATENT DOCUMENTS

| | | |
|---|---|---|
| EP | 2113636 A2 | 3/2009 |
| EP | 2371986 A1 | 3/2011 |

(Continued)

*Primary Examiner* — Cachet Sellman
(74) *Attorney, Agent, or Firm* — Cantor Colburn LLP

(57) ABSTRACT

The present disclosure relates generally to a fixture for use in applying a coating to a multiple vane nozzle for use in a turbomachine. The fixture includes first and second masks that are applied to opposite sides of the nozzle to mimic the geometry and spacing of the vanes of the nozzle.

19 Claims, 3 Drawing Sheets

(56) References Cited

U.S. PATENT DOCUMENTS

2014/0242278 A1\* 8/2014 Hlavaty ............... B05C 21/005
427/282

FOREIGN PATENT DOCUMENTS

| EP | 1925368 B1 | 4/2011 |
|----|------------|--------|
| EP | 2540860 A2 | 2/2013 |

\* cited by examiner

FIXTURE FOR APPLICATION OF COATINGS AND METHOD OF USING SAME

CROSS REFERENCE TO RELATED APPLICATION

This application claims the benefit of and incorporates by reference herein the disclosure of U.S. Ser. No. 61/930,321, filed Jan. 22, 2014.

GOVERNMENT LICENSE RIGHTS

This invention was made with government support under Contract No. N00014-09-D-0821-0001 awarded by the United States Navy. The government has certain rights in the invention.

TECHNICAL FIELD OF THE DISCLOSURE

The present disclosure is generally related to the manufacture and restoration of aerospace components, such as components of gas turbine engines and, more specifically, to a fixture for application of coatings and a method of using same.

BACKGROUND OF THE DISCLOSURE

Gas turbine engines operate by burning a combustible fuel-air mixture, and converting the energy of combustion into a propulsive force. A gas turbine engine typically includes an inlet, a compressor, a combustor, a turbine, and an exhaust duct, where the compressor draws in ambient air and increases its temperature and pressure. Fuel is added to the compressed air in the combustor, where it is burned to raise the gas temperature, thereby imparting energy to the gas stream. The resulting combustion gases are directed axially rearward from the combustor through an annular duct, where the gases interact with multiple turbine stages disposed within the annular duct.

Each turbine stage includes a stationary turbine nozzle derived of multiple stator vanes, and a downstream row of rotatable blades. The stator vanes direct the combustion gases axially rearward in a downstream direction, and the rotatable blades direct the energy of the combustion gases to an axial drive shaft that is interconnected with the compressor. Stator vanes typically have airfoil geometries designated by concave pressure sides and convex suction sides that extend axially between corresponding leading and trailing edges of the airfoils. Each airfoil is also typically disposed circumferentially between an outer arcuate shroud and an inner arcuate platform, thereby forming a nozzle segment. Multiple nozzle segments are interconnected to form the annular ring of the stationary turbine nozzle. Each nozzle segment may be cast to include one or more stator vanes disposed between the same outer arcuate shroud and inner arcuate platform. For example, a nozzle segment containing a single stator vane is typically referred to as a nozzle singlet, a nozzle segment containing two stator vanes is typically referred to as a nozzle doublet, nozzle segment containing three stator vanes is typically referred to as a nozzle triplet, and so on. For ease of description herein, the term "vane cluster" is intended to encompass any nozzle segment having two or more stator vanes. Vane clustering may have several advantages. The reduced engine part count may ease manufacturing and reduce weight. The reduction in the number of platform and shroud gaps (e.g., a halving with nozzle doublets) may have performance advantages.

First, intergap leakage may correspondingly be reduced. Second, diversion of cooling air to cool gap seals may also be reduced.

The components of the turbine stages (e.g., vanes and blades) are required to be able to withstand the thermal and oxidation conditions of the high temperature combustion gas during the course of operation. To protect turbine engine components from the extreme conditions, such components are typically coated with metallic bond coats that provide oxidation and/or corrosion resistance, and with ceramic thermal barrier coatings to provide thermal protection. With vane clusters, each airfoil may interfere with the application of the coating to the adjacent airfoil(s), where the vane cluster geometry provides a mask which affects coating distribution on the "hidden" faces of the airfoils that are not positioned on either end of the vane cluster, thereby reducing the amount of coating which is applied to those areas. Such non-uniformity is further exacerbated by the absence of interference to the application of coating on the surfaces at each end of the vane cluster. This is true even when so-called non-line of sight coating application methods, such as electron beam physical vapor deposition (EB-PVD), are used. The hidden areas therefore may not receive adequate coating thickness due to the exposed areas on either end of the vane cluster reaching the coating thickness limit, thereby creating non-uniformity of coating profiles from vane to vane. The varying coating distribution between the two airfoils creates a situation of mismatched thermal gradients and thermal growth.

SUMMARY OF THE DISCLOSURE

In one embodiment, a fixture for application of a coating to a vane cluster including a cluster platform, a cluster shroud and at least two cluster vanes extending between the cluster platform and the cluster shroud is disclosed, the fixture comprising: a first mask disposed on a first side of the vane cluster, the first mask including: a first mask shroud disposed adjacent the cluster shroud; a first mask platform disposed adjacent the cluster platform; and a first mask vane disposed between the first mask shroud and the first mask platform; and a second mask disposed on a second side of the vane cluster, the second mask including: a second mask shroud disposed adjacent the cluster shroud; a second mask platform disposed adjacent the cluster platform; and a second mask vane disposed between the second mask shroud and the second mask platform.

In a further embodiment of the above, the first mask shroud is arcuate and defines a first mask shroud radius, and the second mask shroud is arcuate and defines a second mask shroud radius.

In a further embodiment of any of the above, the cluster shroud is arcuate and defines a cluster shroud radius substantially equal to the first mask shroud radius and the second mask shroud radius.

In a further embodiment of any of the above, the first mask platform is arcuate and defines a first mask platform radius, and the second mask platform is arcuate and defines a second mask platform radius.

In a further embodiment of any of the above, the cluster platform is arcuate and defines a cluster platform radius substantially equal to the first mask platform radius and the second mask platform radius.

In a further embodiment of any of the above, the at least two cluster vanes, the first mask vane and the second mask vane each include a substantially equal geometry.

In a further embodiment of any of the above, the at least two cluster vanes, the first mask vane and the second mask vane are each disposed at substantially equal angles with reference to an axis of rotation of the vane cluster.

In a further embodiment of any of the above, the at least two cluster vanes, the first mask vane and the second mask vane are each spaced at substantially equal distances from one another.

In another embodiment, a method of applying a coating to a vane cluster including a cluster platform, a cluster shroud and at least two cluster vanes extending between the cluster platform and the cluster shroud is disclosed, the method comprising the steps of: a) disposing a first mask adjacent a first side of the vane cluster, the first mask including: a first mask shroud disposed adjacent the cluster shroud; a first mask platform disposed adjacent the cluster platform; and a first mask vane disposed between the first mask shroud and the first mask platform; and b) disposing a second mask adjacent a second side of the vane cluster, the second mask including: a second mask shroud disposed adjacent the cluster shroud; a second mask platform disposed adjacent the cluster platform; and a second mask vane disposed between the second mask shroud and the second mask platform.

In a further embodiment of the above, step (a) comprises coupling the first mask to the vane cluster and step (b) comprises coupling the second mask to the vane cluster.

In a further embodiment of any of the above, the first mask shroud is arcuate and defines a first mask shroud radius, and the second mask shroud is arcuate and defines a second mask shroud radius.

In a further embodiment of any of the above, the cluster shroud is arcuate and defines a cluster shroud radius substantially equal to the first mask shroud radius and the second mask shroud radius.

In a further embodiment of any of the above, the first mask platform is arcuate and defines a first mask platform radius, and the second mask platform is arcuate and defines a second mask platform radius.

In a further embodiment of any of the above, the cluster platform is arcuate and defines a cluster platform radius substantially equal to the first mask platform radius and the second mask platform radius.

In a further embodiment of any of the above, the at least two cluster vanes, the first mask vane and the second mask vane each include a substantially equal geometry.

In a further embodiment of any of the above, the at least two cluster vanes, the first mask vane and the second mask vane are each disposed at substantially equal angles with reference to an axis of rotation of the vane cluster.

In a further embodiment of any of the above, the at least two cluster vanes, the first mask vane and the second mask vane are each spaced at substantially equal distances from one another.

In a further embodiment of any of the above, further comprising the step of: c) applying a coating to the vane cluster.

In a further embodiment of the above, wherein the coating is selected from the group consisting of: metallic coating, thermal barrier coating, and environmental barrier coating.

In a further embodiment of any of the above, wherein step (c) comprises applying a coating to the vane cluster using a process selected from the group consisting of: electron beam physical vapor deposition, low pressure plasma spray, air spray, and electron beam directed vapor deposition.

Other embodiments are also disclosed.

BRIEF DESCRIPTION OF THE DRAWINGS

The embodiments and other features, advantages and disclosures contained herein, and the manner of attaining them, will become apparent and the present disclosure will be better understood by reference to the following description of various exemplary embodiments of the present disclosure taken in conjunction with the accompanying drawings, wherein.

DETAILED DESCRIPTION OF THE DISCLOSED EMBODIMENTS

For the purposes of promoting an understanding of the principles of the invention, reference will now be made to certain embodiments and specific language will be used to describe the same. It will nevertheless be understood that no limitation of the scope of the invention is thereby intended, and alterations and modifications in the illustrated device, and further applications of the principles of the invention as illustrated therein are herein contemplated as would normally occur to one skilled in the art to which the invention relates.

Figure 1:
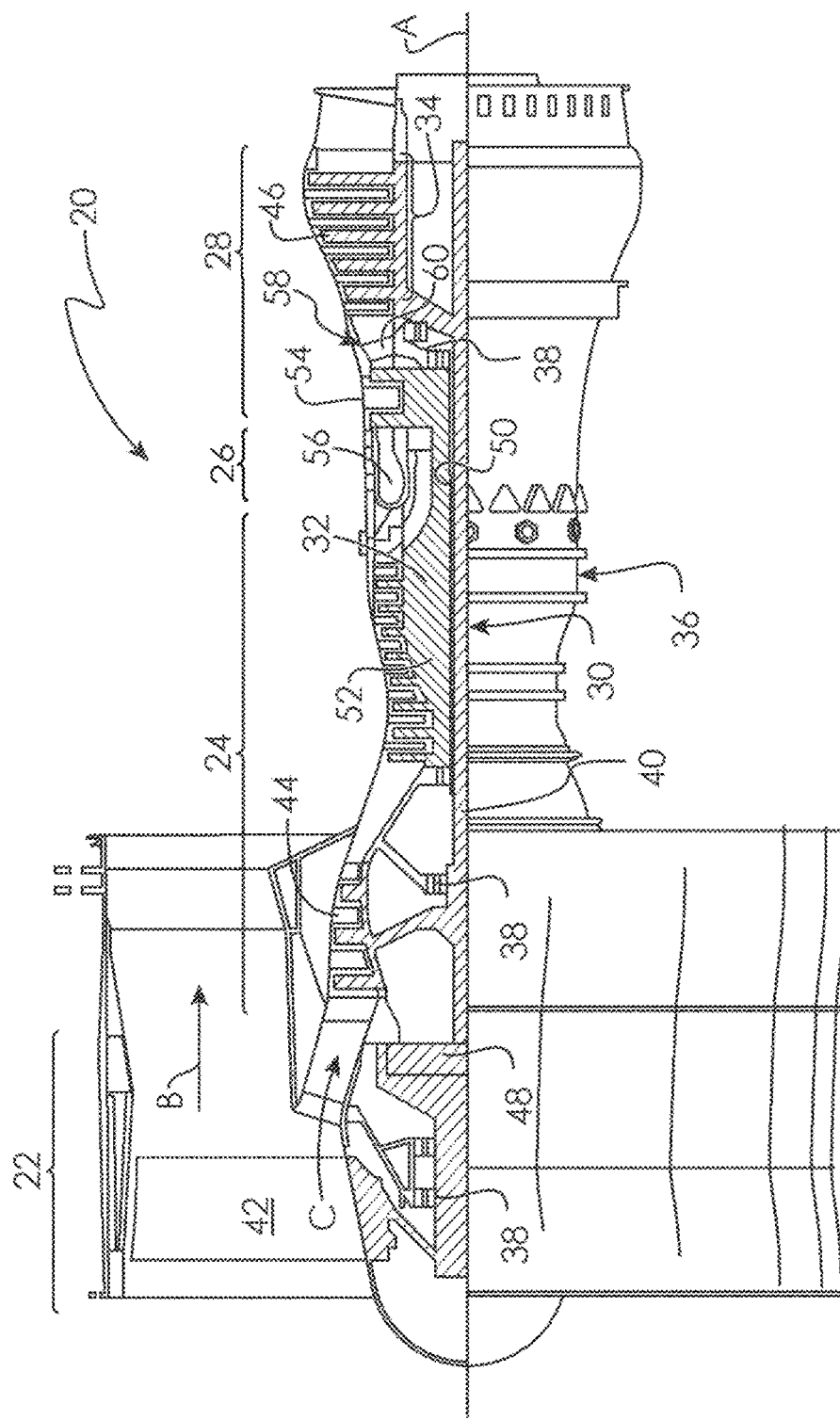
FIG. 1 is a schematic partial cross-sectional view of a gas turbine engine in an embodiment.

FIG. 1 schematically illustrates a gas turbine engine 20. The gas turbine engine 20 is disclosed herein as a two-spool turbofan that generally incorporates a fan section 22, a compressor section 24, a combustor section 26 and a turbine section 28. Alternative engines might include an augmentor section (not shown) among other systems or features. The fan section 22 drives air along a bypass flow path B in a bypass duct, while the compressor section 24 drives air along a core flow path C for compression and communication into the combustor section 26 then expansion through the turbine section 28. Although depicted as a two-spool turbofan gas turbine engine in the disclosed non-limiting embodiment, it should be understood that the concepts described herein are not limited to use with two-spool turbofans as the teachings may be applied to other types of turbine engines including three-spool architectures.

The exemplary engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided, and the location of bearing systems 38 may be varied as appropriate to the application.

The low speed spool 30 generally includes an inner shaft 40 that interconnects a fan 42, a low pressure compressor 44 and a low pressure turbine 46. The inner shaft 40 is connected to the fan 42 through a speed change mechanism, which in exemplary gas turbine engine 20 is illustrated as a geared architecture 48 to drive the fan 42 at a lower speed than the low speed spool 30. The high speed spool 32 includes an outer shaft 50 that interconnects a high pressure compressor 52 and high pressure turbine 54. A combustor 56 is arranged in exemplary gas turbine 20 between the high pressure compressor 52 and the high pressure turbine 54. An engine static structure 36 is arranged generally between the high pressure turbine 54 and the low pressure turbine 46. The engine static structure 36 further supports bearing systems 38 in the turbine section 28. The inner shaft 40 and the outer shaft 50 are concentric and rotate via bearing systems 38 about the engine central longitudinal axis A which is collinear with their longitudinal axes.

The core airflow is compressed by the low pressure compressor 44 then the high pressure compressor 52, mixed and burned with fuel in the combustor 56, then expanded over the high pressure turbine 54 and low pressure turbine 46. The turbines 46, 54 rotationally drive the respective low speed spool 30 and high speed spool 32 in response to the expansion. It will be appreciated that each of the positions of the fan section 22, compressor section 24, combustor section 26, turbine section 28, and fan drive gear system 48 may be varied. For example, gear system 48 may be located aft of combustor section 26 or even aft of turbine section 28, and fan section 22 may be positioned forward or aft of the location of gear system 48.

The engine 20 in one example is a high-bypass geared aircraft engine. In a further example, the engine 20 bypass ratio is greater than about six (6), with an example embodiment being greater than about ten (10), the geared architecture 48 is an epicyclic gear train, such as a planetary gear system or other gear system, with a gear reduction ratio of greater than about 2.3 and the low pressure turbine 46 has a pressure ratio that is greater than about five. In one disclosed embodiment, the engine 20 bypass ratio is greater than about ten (10:1), the fan diameter is significantly larger than that of the low pressure compressor 44, and the low pressure turbine 46 has a pressure ratio that is greater than about five 5:1. Low pressure turbine 46 pressure ratio is pressure measured prior to inlet of low pressure turbine 46 as related to the pressure at the outlet of the low pressure turbine 46 prior to an exhaust nozzle. The geared architecture 48 may be an epicycle gear train, such as a planetary gear system or other gear system, with a gear reduction ratio of greater than about 2.3:1. It should be understood, however, that the above parameters are only exemplary of one embodiment of a geared architecture engine and that the present invention is applicable to other gas turbine engines including direct drive turbofans.

A significant amount of thrust is provided by the bypass flow B due to the high bypass ratio. The fan section 22 of the engine 20 is designed for a particular flight condition—typically cruise at about 0.8 Mach and about 35,000 feet. The flight condition of 0.8 Mach and 35,000 ft, with the engine at its best fuel consumption—also known as "bucket cruise Thrust Specific Fuel Consumption ('TSFC')"—is the industry standard parameter of lbm of fuel being burned divided by lbf of thrust the engine produces at that minimum point. "Low fan pressure ratio" is the pressure ratio across the fan blade alone, without a Fan Exit Guide Vane ("FEGV") system. The low fan pressure ratio as disclosed herein according to one non-limiting embodiment is less than about 1.45. "Low corrected fan tip speed" is the actual fan tip speed in ft/sec divided by an industry standard temperature correction of $[(Tram\ ^\circ\ R)/(518.7^\circ\ R)]^{0.5}$. The "Low corrected fan tip speed" as disclosed herein according to one non-limiting embodiment is less than about 1150 ft/second.

Figure 2:
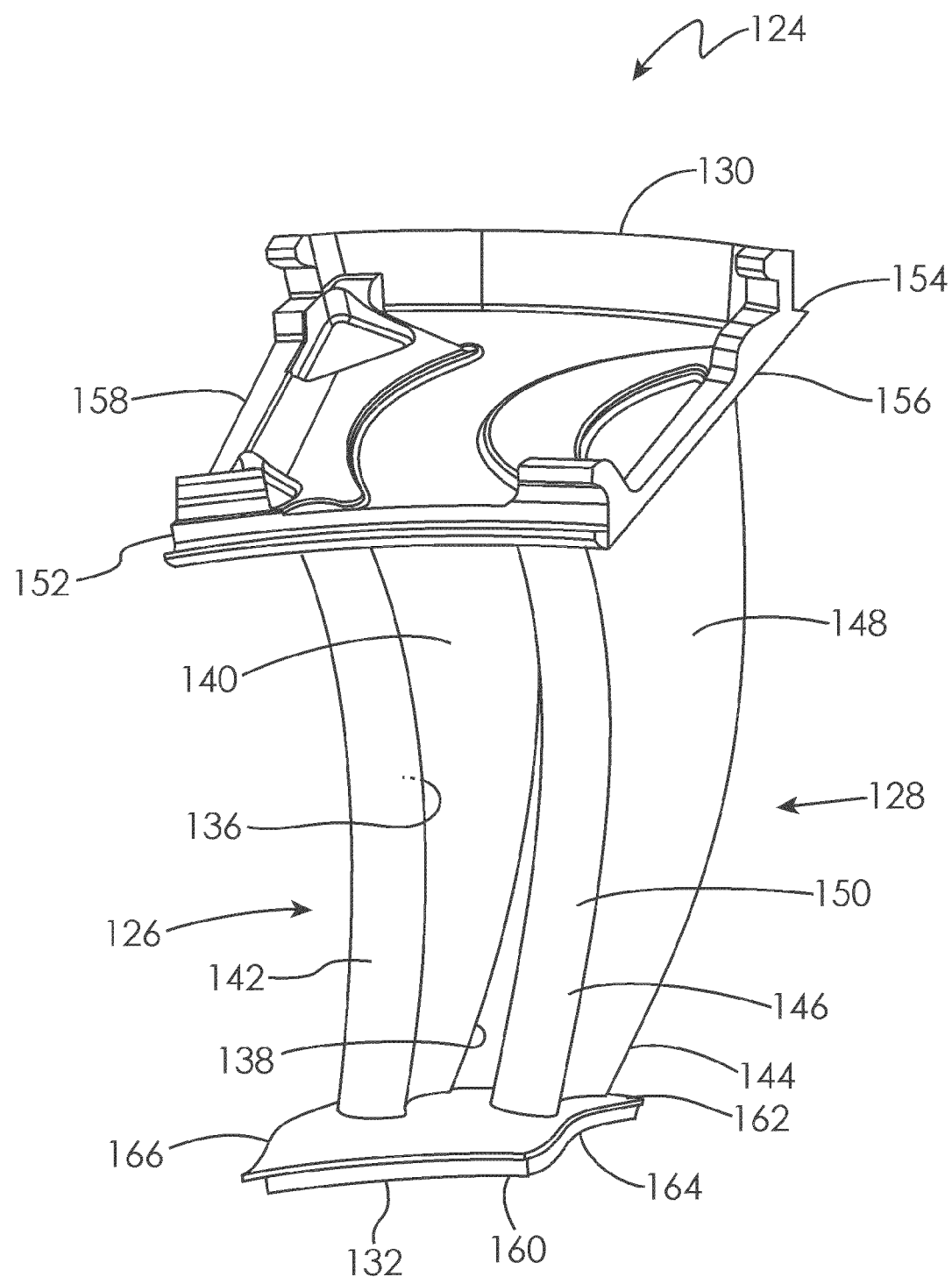
FIG. 2 is a schematic perspective view of a vane cluster in an embodiment.

FIG. 2 schematically illustrates multiple stator vanes of a vane cluster 124. As shown in FIG. 2, vane cluster 124 is illustrated as a nozzle doublet, but vane cluster 124 may have any plural number of stator vanes. The vane cluster 124 may be formed from any desired material, such as titanium, titanium alloy, ceramic matrix composite or monolithic ceramic, to name just a few non-limiting examples. Vane cluster 124 includes vanes 126 and 128, cluster shroud 130, and cluster platform 132. Vanes 126 and 128 may be turbine-stage stator vanes secured between cluster shroud 130 and cluster platform 132 in an embodiment. In other embodiments, the vanes 126 and 128 may be used in other types of turbomachinery. Vane 126 includes leading edge 136, trailing edge 138, pressure sidewall 140, and suction sidewall 142. Pressure sidewall 140 is the concave pressure side of vane 126, which extends between leading edge 136 and trailing edge 138. Correspondingly, suction sidewall 142 is the convex suction side of vane 126, which also extends between leading edge 136 and trailing edge 138, and is the opposing surface to pressure sidewall 140.

Similarly, vane 128 includes trailing edge 144, leading edge 146, pressure sidewall 148, and suction sidewall 150. Pressure sidewall 148 is the concave pressure side of vane 128, which extends between leading edge 146 and trailing edge 144. Correspondingly, suction sidewall 150 is the convex suction side of vane 128, which also extends between leading edge 146 and the trailing edge 144, and is the opposing surface to pressure sidewall 146.

Cluster shroud 130 is an outer arcuate band defining a cluster shroud radius and is secured to vanes 126 and 128. Cluster shroud 130 includes leading edge 152, trailing edge 154, pressure side edge 156, and suction side edge 158, where leading edge 152 and trailing edge 154 are the upstream and downstream edges of shroud 130, respectively. Pressure side edge 156 and suction side edge 158 are the lateral edges of cluster shroud 130, and are the edges that are secured to outer shrouds of adjacent nozzle segments (not shown) with leaf seal engagements, for example, to form a stationary turbine nozzle.

Correspondingly, cluster platform 132 is an inner arcuate band defining a cluster platform radius and is secured to vanes 126 and 128, opposite of cluster shroud 130. Cluster platform 132 includes leading edge 160, trailing edge 162, pressure side edge 164, and suction side edge 166, where leading edge 160 and trailing edge 162 are the upstream and downstream edges of cluster platform 132, respectively. Pressure side edge 164 and suction side edge 166 are the lateral edges of cluster platform 132, and are the edges that are secured to inner platforms of adjacent nozzle segments (not shown) with leaf seal engagements, for example, to form the stationary turbine nozzle.

As shown, suction sidewall 142 of vane 126 and pressure sidewall 148 of vane 128 are outboard surfaces that are directly accessible with many coating techniques. As a result, coatings may be readily deposited on suction sidewall 142 and pressure sidewall 148 with substantially uniform thicknesses. In contrast, however, pressure sidewall 140 of vane 126 and suction sidewall 150 of vane 128 are inboard surfaces, which partially shadow each other. The partial shadowing prevents many coating techniques from evenly depositing coatings on pressure sidewall 140 and suction sidewall 150, thereby reducing coating thickness uniformity across the surfaces of the vanes 126 and 128. An analogous reduction in coating thickness uniformity will result for vane clusters having more than two vanes. The reduction in coating thickness uniformity correspondingly reduces the effectiveness of the formed coatings in providing corrosion, oxidation, and/or thermal resistance during the course of operation in a gas turbine engine.

Figure 3:
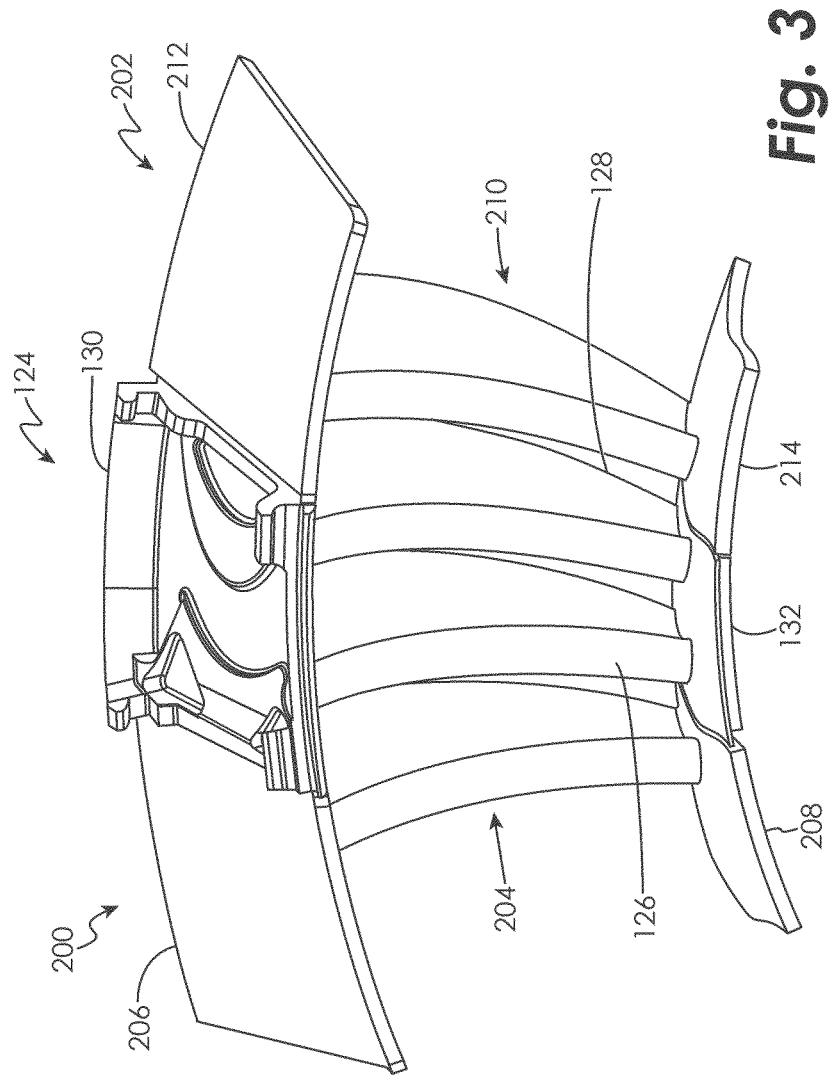
FIG. 3 is a schematic perspective view of a vane cluster and a fixture for application of coatings in an embodiment.

FIG. 3 schematically illustrates one embodiment of a fixture for application of coatings on multiple stator vanes of vane cluster 124. As shown in FIG. 3 (with continuing reference to FIG. 2), the fixture comprises a first mask 200 and a second mask 202. The first mask 200 includes a first mask vane 204 disposed between a first mask arcuate shroud 206 and a first mask arcuate platform 208. The first mask arcuate shroud 206 defines a first mask shroud radius and the first mask arcuate platform 208 defines a first mask platform radius. Similarly, the second mask 202 includes a second mask vane 210 disposed between a second mask arcuate shroud 212 and a second mask arcuate platform 214. The second mask arcuate shroud 212 defines a second mask shroud radius and the second mask arcuate platform 214 defines a second mask platform radius. The first mask shroud 206 abuts the suction side edge 158 of the shroud 130, while the second mask shroud 212 abuts the pressure side edge 156 of the shroud 130, such that the first mask shroud 206 and the second mask shroud 212 continue the arcuate shape of the shroud 130. In other words, the first mask shroud radius, the cluster shroud radius, and the second mask shroud radius are all substantially equal. Similarly, the first mask platform 208 abuts the suction side edge 166 of the platform 132, while the second mask platform 214 abuts the pressure side edge 164 of the platform 132, such that the first mask platform 208 and the second mask platform 214 continue the arcuate shape of the platform 132. In other words, the first mask platform radius, the cluster platform radius, and the second mask platform radius are all substantially equal. The first vane 126, second vane 128, first mask vane 204 and second mask vane 210 each have substantially the same geometry, are disposed at substantially equal angles with reference to an axis of rotation of the vane cluster 124, and are spaced at substantially equal distances from one another.

The mask 200/202 may be applied to the vane cluster 124 prior to applying one or more coatings to the vane cluster 124. The mask 200/202 may be used when applying any type of coating, such as metallic coatings, thermal barrier coatings, and environmental barrier coatings, to name just a few non-limiting examples. Any desired means may be employed to couple the first mask 200 and the second mask 202 to the vane cluster 124. In one embodiment, the first mask 200 and the second mask 202 are simply positioned adjacent to the vane cluster 124 without physically coupling them to the vane cluster 124. The mask 200/202 may be used with any type of coating process, such as electron beam physical vapor deposition, low pressure plasma spray, air spray, and electron beam directed vapor deposition, to name just a few non-limiting examples. In an exemplary electron beam physical vapor deposition process, the vane cluster 124 with the mask 200/202 applied is placed on a rotatable mount in a vacuum chamber containing a target anode derived of the desired coating material. A charged tungsten filament then emits an electron beam that contacts the target anode, thereby ionizing the material of the target anode. The ionized particles then precipitate onto pressure sidewall 140 and suction side wall 142 of vane 126 and onto pressure sidewall 148 and suction side wall 150 of vane 128 to form the desired metallic coatings. Examples of materials for the metallic coatings in some embodiments include aluminum, platinum, MCrAlY alloys, and combinations thereof. Examples of average thicknesses for the metallic coatings on vanes 126 and 128 range in some embodiments from about 12 micrometers to about 200 micrometers, with particularly suitable thicknesses ranging from about 50 micrometers to about 100 micrometers.

The above-discussed coating process may also be used to form thermal/environmental barrier coatings on vanes 126 and 128. Examples materials for the thermal/environmental barrier coatings in some embodiments include zirconia-based materials, where the zirconia may be modified with a stabilizer to prevent the formation of a monoclinic phase, and pyrochlores. Examples of stabilizers in some embodiments include yttria, gadolinia, calcia, ceria, magnesia, and combinations thereof. Examples of coating thicknesses for the thermal/environmental barrier coatings on stator vanes 126 and 128 range in some embodiments from about 12 micrometers to about 1,000 micrometers, with particularly suitable coating thicknesses ranging from about 100 micrometers to about 500 micrometers.

The shape and orientation of the mask 200/202 when applied to the vane cluster 124 ensures that the outboard surfaces comprising suction sidewall 142 of vane 126 and pressure sidewall 148 of vane 128 will have the same exposure to the coating application source as the inboard surfaces comprising pressure sidewall 140 of vane 126 and suction sidewall 150 of vane 128, which partially shadow each other. The partial shadowing of suction sidewall 142 of vane 126 by vane 204 of the first mask 200 and the partial shadowing of pressure sidewall 148 of vane 128 by the vane 210 of second mask 202 ensures consistent exposure of all surfaces. The masking provided by mask 200/202 also provides a similar exposure for the cluster shroud 130 and cluster platform 132 areas between the vanes 126 and 128 compared to the cluster shroud 130 and cluster platform 132 areas outside of the vanes 126 and 128. Therefore, the mask 200/202 provides for increased coating distribution similarity over the surfaces between the vanes 126 and 128 within the vane cluster 124. By masking both airfoils within the vane cluster 124 in the same way and limiting the amount of exposed surface, the "hidden" areas can now be coated up to the thickness limit resulting in an overall increase in coating, thereby increasing coating thickness uniformity across the surfaces of the vanes 126 and 128, the cluster shroud 130, and the cluster platform 132. An analogous increase in coating thickness uniformity will result for vane clusters having more than two vanes. The increase in coating thickness uniformity correspondingly increases the effectiveness of the formed coatings in providing corrosion, oxidation, and/or thermal resistance during the course of operation in a gas turbine engine.

While the invention has been illustrated and described in detail in the drawings and foregoing description, the same is to be considered as illustrative and not restrictive in character, it being understood that only certain embodiments have been shown and described and that all changes and modifications that come within the spirit of the invention are desired to be protected.

What is claimed:

1. A fixture for application of a coating to a vane cluster including a cluster platform, a cluster shroud and at least two cluster vanes extending between the cluster platform and the cluster shroud, the fixture comprising:
   a first mask disposed on a first side of the vane cluster, the first mask including:
      a first mask shroud disposed adjacent the cluster shroud;
      a first mask platform disposed adjacent the cluster platform; and
      a first mask vane disposed between the first mask shroud and the first mask platform; and
   a second mask disposed on a second side of the vane cluster, the second mask including:
      a second mask shroud disposed adjacent the cluster shroud;
      a second mask platform disposed adjacent the cluster platform; and
      a second mask vane disposed between the second mask shroud and the second mask platform.

2. The fixture of claim 1, wherein the first mask shroud is arcuate and defines a first mask shroud radius, and the second mask shroud is arcuate and defines a second mask shroud radius.

3. The fixture of claim 2, wherein the cluster shroud is arcuate and defines a cluster shroud radius substantially equal to the first mask shroud radius and the second mask shroud radius.

4. The fixture of claim 1, wherein the first mask platform is arcuate and defines a first mask platform radius, and the second mask platform is arcuate and defines a second mask platform radius.

5. The fixture of claim 4, wherein the cluster platform is arcuate and defines a cluster platform radius substantially equal to the first mask platform radius and the second mask platform radius.

6. The fixture of claim 1, wherein the at least two cluster vanes, the first mask vane and the second mask vane each include a substantially equal geometry.

7. The fixture of claim 1, wherein the at least two cluster vanes, the first mask vane and the second mask vane are each disposed at substantially equal angles with reference to an axis of rotation of the vane cluster.

8. The fixture of claim 1, wherein the at least two cluster vanes, the first mask vane and the second mask vane are each spaced at substantially equal distances from one another.

9. A method of applying a coating to a vane cluster including a cluster platform, a cluster shroud and at least two cluster vanes extending between the cluster platform and the cluster shroud, the method comprising the steps of:
 a) disposing a first mask adjacent a first side of the vane cluster, the first mask including: a first mask shroud disposed adjacent the cluster shroud; a first mask platform disposed adjacent the cluster platform; and a first mask vane disposed between the first mask shroud and the first mask platform;
 b) disposing a second mask adjacent a second side of the vane cluster, the second mask including: a second mask shroud disposed adjacent the cluster shroud; a second mask platform disposed adjacent the cluster platform; and a second mask vane disposed between the second mask shroud and the second mask platform; and
 c) applying a coating to the vane cluster.

10. The method of claim 9, wherein step (a) comprises coupling the first mask to the vane cluster and step (b) comprises coupling the second mask to the vane cluster.

11. The method of claim 9, wherein the first mask shroud is arcuate and defines a first mask shroud radius, and the second mask shroud is arcuate and defines a second mask shroud radius.

12. The method of claim 11, wherein the cluster shroud is arcuate and defines a cluster shroud radius substantially equal to the first mask shroud radius and the second mask shroud radius.

13. The method of claim 9, wherein the first mask platform is arcuate and defines a first mask platform radius, and the second mask platform is arcuate and defines a second mask platform radius.

14. The method of claim 13, wherein the cluster platform is arcuate and defines a cluster platform radius substantially equal to the first mask platform radius and the second mask platform radius.

15. The method of claim 9, wherein the at least two cluster vanes, the first mask vane and the second mask vane each include a substantially equal geometry.

16. The method of claim 9, wherein the at least two cluster vanes, the first mask vane and the second mask vane are each disposed at substantially equal angles with reference to an axis of rotation of the vane cluster.

17. The method of claim 9, wherein the at least two cluster vanes, the first mask vane and the second mask vane are each spaced at substantially equal distances from one another.

18. The method of claim 9, wherein the coating is selected from the group consisting of: metallic coating, thermal barrier coating, and environmental barrier coating.

19. The method of claim 9, wherein step (c) comprises applying a coating to the vane cluster using a process selected from the group consisting of:
 electron beam physical vapor deposition, low pressure plasma spray, air spray, and electron beam directed vapor deposition.

* * * * *